US006045614A

United States Patent [19]
de Lyon et al.

[11] Patent Number: 6,045,614
[45] Date of Patent: *Apr. 4, 2000

[54] METHOD FOR EPITAXIAL GROWTH OF TWIN-FREE, (111)-ORIENTED II-VI ALLOY FILMS ON SILICON SUBSTRATES

[75] Inventors: Terence J. de Lyon, Newbury Park; Scott M. Johnson, Santa Barbara, both of Calif.

[73] Assignee: Raytheon Company, Lexington, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/618,655

[22] Filed: Mar. 14, 1996

[51] Int. Cl.$^7$ .................................................. C30B 25/18
[52] U.S. Cl. ......................... 117/100; 117/101; 117/104; 117/107; 117/956; 257/442
[58] Field of Search ..................... 117/956, 107, 117/104, 101, 100; 257/442; 148/33.1

[56] References Cited

U.S. PATENT DOCUMENTS

| 5,057,183 | 10/1991 | Tomomura et al. | 117/956 |
| 5,302,232 | 4/1994 | Ebe et al. | |
| 5,394,826 | 3/1995 | Ebe et al. | 117/101 |

FOREIGN PATENT DOCUMENTS

| 61-205694 | 9/1986 | Japan | 117/956 |
| 9215013 | 8/1989 | Japan | 117/956 |

OTHER PUBLICATIONS

Nomura et al, "Single Source MOVPE Growth of Zinc Sulfide Thin Films Using Zinc Dithiocarbanate Complexes", Thin Solid Films vol. 271(1995) pp 4–7.

Faurie, J. P., et al., "Heteroepitaxy of CdTe on Si substates in view of infrared and x-ray detection", Photodetectors: Materials and Devices, San Jose CA USA, Feb. 1–2, 1996, vol. 2685, pp. 28–40, XP002099485 ISSN 0277-786X, SPIE, Oct. 1996.

M.O. Möller et al, "Theoretical x-ray Bragg reflection widths and reflectivities of II–VI semiconductors", *Journal of Applied Physics,* vol. 72, No. 11, pp. 5108–5116 (Dec. 1, 1992).

A. Raizman et al, "Twin microstructure and effective particle size in (111)CdTe and ZnTe grown by metalorganic chemical vapor deposition", *Journal of Applied Physics,* vol. 67, No. 3, pp. 1554–1561 (Feb. 1, 1990).

S.M. Johnson, et al, "X–ray diffraction analysis of Heteroepitaxial $Cd_{1-y}Zn_y Te$ on GaAs", *Material Research Society Symposium Proceedings,* vol. 144, pp. 121–126 (1989).

D.J. Olego et al, "Optoelectronic properties of $Cd_{1-x}Zn_x Te$ films grown by molecular beam epitaxy on GaAs substrates", *Applied Physics Letters,* vol. 47, No. 11, pp. 1172–1174 (Dec. 1, 1985).

(List continued on next page.)

*Primary Examiner*—Robert Kunemund
*Attorney, Agent, or Firm*—William C. Schubert; Glenn H. Lenzen, Jr.

[57] ABSTRACT

A method is provided for depositing a (111)-oriented heteroepitaxial II–VI alloy film on Si substrates. The (111)-oriented heteroepitaxial II–VI alloy film may comprise II–VI semiconductor and/or II–VI semimetal. As such, the method of the present invention provides a means for growing a (111)-oriented heteroepitaxial II–VI semiconductor film or a (111)-oriented heteroepitaxial II–VI semimetal film. The method of the present invention overcomes the inherent difficulties associated with forming (111)-oriented heteroepitaxial II–VI alloy films on Si(001). These difficulties include twin formation and poor crystalline quality. The novelty of the method of the present invention consists principally in choosing a Si substrate having a surface which has a specific Si crystallographic orientation. In particular, the present invention utilizes a Si surface having a crystallographic orientation near Si(111) rather than Si(001). The Si surface is vicinal Si(111). The angle of the misorientation of the Si surface from the Si(111) plane can range from 2° to 8°.

22 Claims, 1 Drawing Sheet

OTHER PUBLICATIONS

R.D. Feldman et al, "Growth of $Cd_{1-x}Zn_xTe$ films by molecular beam epitaxy", *Applied Physics Letters,* vol. 49, No. 13, pp. 797–799 (Sep. 29, 1986).

S.M. Johnson et al, "Heteroepitaxial HgCdTe/CdZnTe/GaAs/Si materials for infrared focal plane arrays", Materials Research Society Symposium, vol. 216, pp. 141–146 (1991).

R. Sporken et al, "Molecular–beam epitaxy of CdTe on large area Si(100)", *Journal of Vacuum Science and Technology B,* vol. 9, No. 3, pp. 1651–1655 (May/Jun. 1991).

R. Sporken et al, "Current status of direct growth of CdTe and HgCdTe on silicon by molecular–beam epitaxy", *Journal of Vacuum Science and Technology B,* vol. 10, No. 4, pp. 1405–1409 (Jul./Aug. 1992).

Y.P. Chen et al, "Structure of CdTe(111)B grown by MBE on misoriented Si(001)," *Journal of Electronic Materials,* vol. 22, No. 8, pp. 951–957 (1993); and.

M. Oron et al, "X–ray study of the crystalline structure of CdTe grown on (001), (111)A, and (111)B CdTe surfaces by metalorganic chemical vapor deposition", *Applied Physics Letters,* vol. 52, No. 13, pp. 1059–1061 (Mar. 28, 1988).

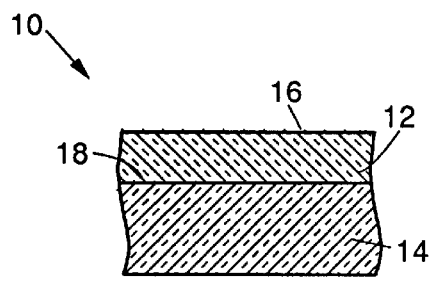
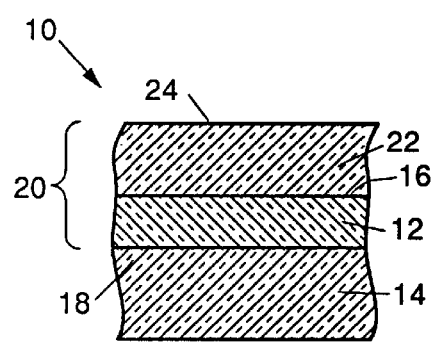
FIG. 1a.  FIG. 1b.
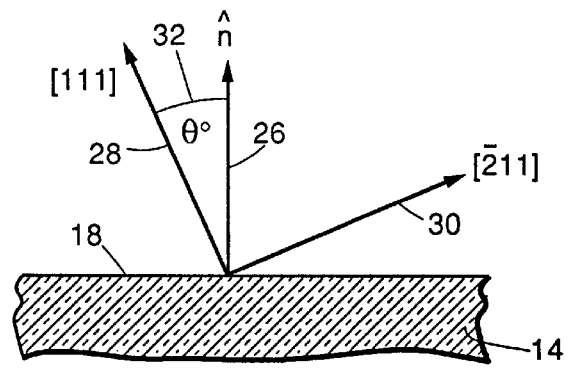
FIG. 2.
FIG. 3.
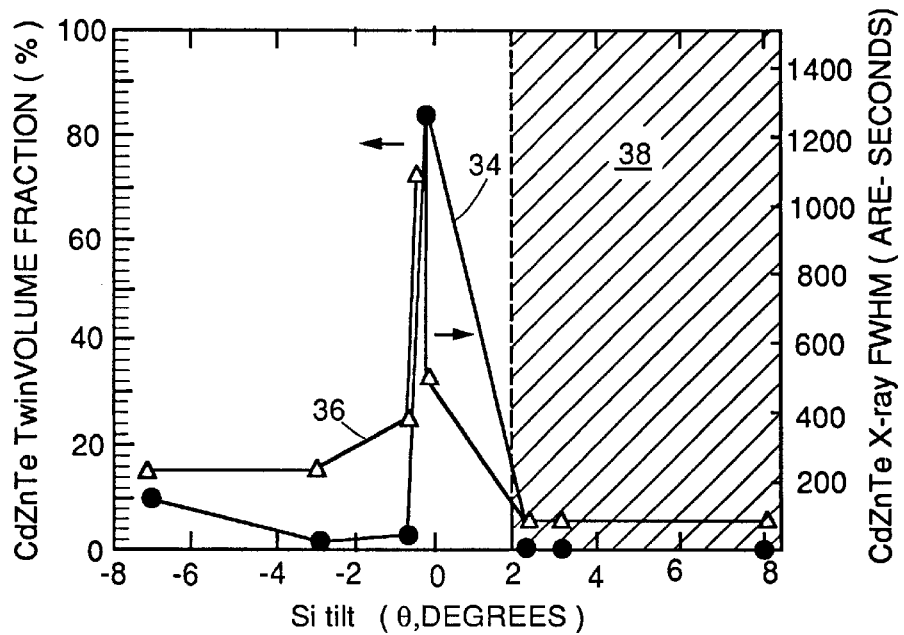

METHOD FOR EPITAXIAL GROWTH OF TWIN-FREE, (111)-ORIENTED II-VI ALLOY FILMS ON SILICON SUBSTRATES

BACKGROUND OF THE INVENTION

1. Field of the Invention

The present invention is directed to the fabrication of II–VI alloy films, such as HgCdTe, on silicon for use in infrared (IR) detectors and detector arrays. More particularly, the present invention is directed to the growth of epitaxial II–VI(111) alloy films, such as HgCdTe(111), over large Si substrates for use in IR detectors and detector arrays.

2. Description of Related Art

Conventional HgCdTe IR detectors and detector arrays require epitaxial HgCdTe. CdTe and CdZnTe single crystals are the most widely used substrates for epitaxial growth of HgCdTe. CdTe and CdZnTe single crystals, however, are expensive and difficult to produce with large area. CdTe and CdZnTe substrates are also fragile and difficult to handle. Accordingly, other materials such as silicon and GaAs have been suggested as alternative substrates for HgCdTe. Silicon is especially promising because of low cost, large area, and good mechanical strength of silicon substrates. Additionally, the use of silicon substrates enables the prospect of fabricating monolithic focal plane arrays combining HgCdTe detectors with silicon integrated circuits. The silicon integrated circuits can be used for signal processing. Typically, a CdTe buffer layer is grown first on these alternative substrates, followed by the growth of the HgCdTe layer.

The use of silicon substrates for depositing HgCdTe is not without problems. Thermal mismatch between CdTe and Si produces additional strain to the CdTe buffer layer which is already strained. The large lattice constant mismatch between HgCdTe and Si results in the formation of a high density of threading dislocations in the II–VI composite film comprising the HgCdTe formed on the CdTe buffer layer. Additionally, the difference in coefficient of thermal expansion between HgCdTe and Si produces strain in the II–VI composite film. The strain develops as the structure consisting of the II–VI composite film formed on the Si substrate is cooled from elevated growth temperatures.

The use of Si as a substrate for HgCdTe infrared focal plane arrays (IRFPA's) is primarily motivated by: (1) the need to overcome the thermal cycle reliability limitations of hybrids formed by indium-bump bonding of HgCdTe array on bulk CdZnTe substrates to Si readout chips, and (2) the need to reduce system costs for implementation of large-area arrays.

For HgCdTe growth on CdTe and CdZnTe by liquid phase epitaxy (LPE), CdTe(111) and CdZnTe(111) are highly preferred over other crystallographic orientations. Heteroepitaxial growth of (111)-oriented CdTe on Si and GaAs substrates has been demonstrated in prior art. By (111)-oriented CdTe is meant CdTe(111). As used herein, CdTe (111) refers to epitaxial grown CdTe crystal having a surface that is a CdTe(111) face or CdTe(111) plane.

To perform heteroepitaxial growth of (111)-oriented CdTe or (111)-oriented CdZnTe on Si or GaAs substrates, vapor-phase techniques have been employed. In particular, molecular beam epitaxy (MBE) and metalorganic chemical vapor deposition (MOCVD) have been employed. Heteroepitaxial growth of (111)-oriented CdTe and (111)-oriented CdZnTe on Si or GaAs substrates by vapor-phase techniques, however, has historically been plagued by twin formation.

CdTe crystal comprises Cd and Te atoms arranged in a lattice having a zincblende structure (or sphalerite structure). CdTe can be visualized as being composed of a stack of close-packed planes. These closed-packed planes are parallel to the (111) plane of the zincblende structure, i.e., the CdTe(111) plane. Each close-packed plane comprises of a double sheet of atoms. Each of these close-packed planes possesses an identical arrangement of atoms as seen from the [111] direction. Each close-packed plane, however, is different from the two adjacent close-packed planes in that the atoms in each of these three planes are shifted with respect to the other two planes. All the atoms in each of the planes are shifted by a constant distance within the plane. These three different planes, denoted, e.g., A, B, C, can be visualized as comprising the CdTe crystal.

Two equivalent isoenergetic sequences of the closed-packed planes are possible: ABCABC and the reverse one, namely, BACBAC. A twin is formed when these two sequences are stacked on top of each other or if these two sequences nucleate side by side. The crystalline ordering of the twin is the mirror image of the original crystal.

X-ray analysis can be used to reveal the presence of twinning in a crystalline sample. An x-ray diffractometer, for example, can be employed to diffract x-rays from the crystalline sample. These diffracted x-rays are detected with a detector.

X-rays incident on a crystalline sample are diffracted in different directions. The x-rays diffracted from the crystalline sample form a pattern of reflection spots that comprise the Laue pattern. The Laue pattern may comprise symmetrically and/or asymmetrically oriented reflection spots. The Laue pattern comprises a series of reflection spots characteristic of the particular crystallographic orientation of the surface of the crystalline sample. Extra reflection spots observed in the Laue pattern indicate the presence of twins. Thus, the presence of twins in a crystalline sample can be revealed by the measurement of appropriately selected x-ray reflections.

More detailed information about the crystalline structure of the crystalline sample can be gained using different diffraction techniques. In particular, measuring the linewidth of symmetric reflection spots, or reflections, can be used to probe the crystalline quality. An example of such a symmetric reflection is the (333) reflection., i.e., the (333) Bragg reflection. Typically, the strength of the reflection at the detector of the x-ray diffractometer is measured as the sample is tilted or rocked. An x-ray rocking curve is produced by plotting of the strength of the reflection measured at the detector as the sample is rocked. The crystalline quality of the crystalline sample is assessed from the width, e.g. full width at half maximum (FWHM), of the x-ray rocking curve. Narrow diffraction lines indicate better crystallinity. Subgrain structure, dislocations, inhomogeneous strains, bending, and other extended defects contribute to the linewidth.

The theoretical width of the (333) reflection for a perfect crystal of CdTe is 4.7 arc-seconds. The theoretical width of the (333) reflection is much smaller than the width of the (111) reflection, which is 20.7 arc-seconds; see e.g., M. O. Möller et al, "Theoretical x-ray Bragg reflection widths and reflectivities of II–VI semiconductors", *Journal of Applied Physics*, Vol. 72, No. 11, pp. 5108–5116 (Dec. 1, 1992). Accordingly, linewidth measurements of the (333) reflection provide a better signal-to-noise ratio than linewidth measurements of the (111) reflections for use in assessing crystal quality.

As described above, twins are common defects in layers of CdTe(111) and HgCdTe(111) grown from the gas phase by MBE and MOCVD.

Twining in CdTe(111) and CdZnTe(111) films have been observed to be a problem for vapor-phase growth on GaAs substrates; see, e.g., A. Raizman et al, "Twin microstructure and effective particle size in (111)CdTe and ZnTe grown by metalorganic chemical vapor deposition," *Journal of Applied Physics*, Vol. 67, No. 3, pp. 1554–1561 (Feb. 1, 1990) who report twin formation in CdTe(111) which is grown on GaAs. See also, e.g., S. M. Johnson, et al, "X-ray diffraction analysis of Heteroepitaxial $Cd_{1-y}Zn_yTe$ on GaAs", *Material Research Society Symposium Proceedings*, Vol. 144, pp. 121–126 (1989), who document twins formed in CdZnTe(111) which is grown on GaAs(111). D. J. Olego et al, "Optoelectronic properties of $Cd_{1-x}Zn_xTe$ films grown by molecular beam epitaxy on GaAs substrates", *Applied Physics Letters*, Vol. 47, No. 11, pp. 1172–1174 (Dec. 1, 1985) and R. D. Feldman et al, "Growth of $Cd_{1-x}Zn_xTe$ films by molecular beam epitaxy", *Applied Physics Letters*, Vol. 49, No. 13, pp. 797–799 (Sep. 29, 1986) also report the growth of CdZnTe(111) on GaAs, in particular, GaAs(100); however, twinning is not discussed.

A Si(001) surface has been utilized as a starting substrate in prior art attempts to deposit CdZnTe(111) and CdTe(111) films on Si. Twins are reported to be formed in CdZnTe(111) which is grown on a structure comprising GaAs(100) formed on Si(100); see, e.g., S. M. Johnson et al, "Heteroepitaxial HgCdTe/CdZnTe/GaAs/Si materials for infrared focal plane arrays", Material Research Society Symposium, Vol. 216, pp. 141–146 (1991).

CdTe is also deposited directly on the Si(001) surface; see, e.g., (i) R. Sporken et al, "Molecular-beam epitaxy of CdTe on large area Si(100)," *Journal of Vacuum Science and Technology B*, Vol. 9, No. 3, pp. 1651–1655 (May/June 1991), (ii) R. Sporken et al, "Current status of direct growth of CdTe and HgCdTe on silicon by molecular-beam epitaxy," *Journal of Vacuum Science and Technology B*, Vol. 10, No. 4, pp. 1405–1409 (July/August 1992), and (iii) Y. P. Chen et al, "Structure of CdTe(111)B grown by MBE on misoriented Si(001)," *Journal of Electonic Materials*, Vol. 22, No. 8, pp. 951–957 (1993), who report the growth of twin-free CdTe(111) on vicinal Si(001). As used herein, the term "vicinal Si(001)" refers to an epitaxial grown Si crystal having a surface that is a plane having an orientation near to, but not including, the exact Si(001) plane. To achieve twin-free CdTe(111) growth, CdTe was formed on a vicinal Si(001) plane which was tilted more than 8° away from the exact Si(001) plane. Forming CdTe on a vicinal Si(001) plane having such large misorientations away from the exact Si(001) plane, however, results in extremely poor CdTe x-ray rocking curve widths. These x-ray rocking curve widths are greater than 600 arc-seconds. Forming CdTe on vicinal Si(001) planes having smaller misorientations away from the exact Si(001) plane are reported to result in an improvement in x-ray rocking curves. These x-ray rocking curve widths are reported to be as low as 140 arc-seconds. For these smaller misorientations, however, the CdTe(111) epitaxial layers, or epilayers, are heavily twinned. Chen et al also report that by subjecting the CdTe(111) film having x-ray rocking curve widths of 140 arc-seconds to a post-growth thermal anneal, then the x-ray rocking curves widths are reduced to 100 arc-seconds and the CdTe(111) film exhibit no twins in the top portion of the CdTe(111) film. However, TEM measurements, which are localized to the top of the CdTe(111) film, are used by Chen et al to establish the absence of twinning at the top portion of the CdTe(111) film. In contrast, x-ray measurements which would penetrate throughout most of the CdTe(111) films would show buried twins. Additionally, a post-growth anneal is required to reduce the x-ray rocking curve width.

Accordingly, the choice of a vicinal Si(001) surface for deposition of CdTe appears to result in a significant problem with obtaining a CdTe(111) epilayer having both (1) low twin density and (2) high crystalline quality.

As such, no effective technique is presently available for providing twin-free vapor-phase growth of (111)-oriented epitaxial II–VI alloy films that also provides high crystalline quality. By (111)-oriented epitaxial II–VI alloy films is meant epitaxial grown films comprising II–VI materials which have a surface that corresponds to the (111) face of a zincblende structure. In particular, at present, no technology has been demonstrated for depositing non-twinned CdZnTe (111) epitaxial layers or epilayers on Si substrates.

Thus, there remains a need for a method of forming epitaxial films comprising (111)-oriented II–VI materials on Si substrates which simultaneously achieves (1) low twin density and (2) high crystalline quality.

SUMMARY OF THE INVENTION

In accordance with the invention, a method is provided for forming at least one substantially twin-free epitaxial II–VI alloy film on a silicon substrate. Additionally, the epitaxial II–VI alloy film has a surface that corresponds to the (111) face of the zincblende structure. The method comprises the steps of:

(a) providing a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (b) epitaxially depositing a first layer of the II–VI alloy film on the surface of the vicinal Si(111) substrate, the first layer of the II–VI alloy film being substantially twin-free. A second layer of the II–VI alloy film may then be epitaxially deposited on the first layer. The second layer of the II–VI alloy film is also substantially twin-free. By II–VI alloy film is meant an alloy formed by combining at least one Group II element with at least one Group VI element. The II–VI alloy film may comprise II–VI semiconductor and/or II–VI semimetal. As such, the method of the present invention provides a means for growing an epitaxial II–VI semiconductor film as well as an epitaxial II–VI semi-metal film.

The method of the present invention overcomes the inherent difficulties associated with forming (111)-oriented heteroepitaxial II–VI alloy films on Si(001). These difficulties include twin formation and poor crystalline quality. The method of the present invention overcomes these difficulties by utilizing a specific vicinal Si(111) plane for depositing the II–VI alloy instead. The utility of this vicinal Si(111) plane for depositing the II–VI alloy has not been disclosed in prior art.

BRIEF DESCRIPTION OF THE DRAWINGS

FIG. 1a is a cross-sectional view, depicting one embodiment of the crystal structure of the present invention comprising a single CdZnTe(111) epitaxial layer deposited on a vicinal Si(111) substrate;

FIG. 1b is a cross-sectional view, depicting another embodiment of the crystal structure of the present invention comprising a CdZnTe(111) epitaxial layer deposited on a ZnTe (111) epitaxial layer which is formed on a vicinal Si(111) substrate;

FIG. 2 is a cross-sectional view of the vicinal Si(111) substrate which specifies the angle θ which corresponds to the angle that the vicinal Si(111) plane is tilted away from the exact Si(111) plane for twin-free growth of CdZnTe (111); and FIG. 3, on coordinates of CdZnTe twin volume fraction (in percent), CdZnTe x-ray FWHM (in arc-seconds), and θ (in degrees), is a plot of the amount of twinning of the CdZnTe(111) epitaxial layer and the width of the x-ray rocking curve versus angle that the vicinal Si(111) plane is tilted away from the exact Si(111) plane.

DESCRIPTION OF THE PREFERRED EMBODIMENTS

In accordance with the invention, a method is provided for depositing a (111)-oriented heteroepitaxial II–VI alloy film on Si substrates. As described above, by (111)-oriented heteroepitaxial II–VI alloy film is meant an epitaxial film comprising a II–VI alloy which has a surface that corresponds to the (111) face of a zincblende structure. By II–VI alloy is meant an alloy formed by combining at least one Group II element with at least one Group VI element. The (111)-oriented heteroepitaxial II–VI alloy film may comprise II–VI semiconductor and/or II–VI semimetal. As such, the method of the present invention provides a means for growing a (111)-oriented heteroepitaxial II–VI semiconductor film as well as a (111)-oriented heteroepitaxial II–VI semimetal film.

The (111)-oriented epitaxial II–VI alloy film of the present invention possesses high crystalline quality. Additionally, the (111)-oriented epitaxial II–VI alloy film of the present invention is epitaxially grown without the formation of twins or microtwin defects. As described above, such microtwin defects are typically observed for (111)-oriented heteroepitaxial II–VI alloy films which are grown using conventional vaporphase deposition techniques.

A novel aspect of the present invention is the choice of a Si substrate having a surface which has a specific Si crystallographic orientation. In particular, the present invention utilizes a Si surface having a crystallographic orientation near Si(111) rather than Si(001). The Si surface is vicinal Si(111). The angle of the misorientation of the Si surface from the Si(111) plane can range from 2° to 8°.

FIG. 1a depicts one example of the epitaxially-coated crystalline substrate structure 10 of the present invention. In this first embodiment, a first layer of II–VI alloy 12 is formed on a vicinal Si(111) substrate 14. The first layer of II–VI alloy 12 has a surface 16 that corresponds to the (111) face of the zincblende structure. In particular, the first layer of II–VI alloy 12 comprises a CdZnTe(111) epitaxial layer. In this first embodiment, the first layer of II–VI alloy 12 serves as a CdZnTe buffer layer. The vicinal Si(111) substrate (i.e., silicon substrate) 14 has a surface 18 that is a vicinal Si(111) plane. The first layer of II–VI alloy 12 is formed by depositing CdZnTe on the surface 18 of the vicinal Si(111) substrate 14. Deposition techniques such as MBE or OMVPE (organometallic vapor phase epitaxy) can be employed to deposit the CdZnTe. Optimum growth conditions are employed in the deposition of the II–VI alloy. Such growth conditions are conventional and are described in the abovementioned disclosed art, see, e.g., Y. P. Chen et al, supra. Other suitable deposition techniques may be employed in the practice of the invention as well.

The surface 18 of the vicinal Si(111) substrate 14 is a vicinal Si(111) plane. The vicinal Si(111) plane is tilted 2° to 8° away from the exact Si(111) plane towards the (211) plane. That is, the normal through the surface 18 of the vicinal Si(111) substrate 14 is tilted toward the [211] direction. The term "normal" is used herein in its accepted meaning of "perpendicular". The normal through the surface 18 of the vicinal Si(111) substrate 14 may alternatively be tilted toward other crystallographically equivalent directions. The other crystallographically equivalent directions are the [121] direction and the [112] direction.

The use of the vicinal Si(111) plane of the present invention enables the CdZnTe(111) epitaxial layer 12 to be formed without twinning ("substantially twin-free") throughout the entire volume of the CdZnTe(111) epitaxial layer as determined by x-ray diffraction. X-ray diffraction, which probes the entire depth of the film, will not reveal any twin volume density in the CdZnTe(111) epitaxial layer 12 of the present invention. As such, a II–VI semiconductor film having a surface that corresponds to the (111) face of the zincblende structure is formed without forming twins therein. In this first embodiment, the epitaxial II–VI alloy film corresponds to an epitaxial II–VI semiconductor film comprising the first layer of II–VI alloy 12, i.e., the CdZnTe (111) epitaxial layer.

FIG. 1b depicts another example of the structure 10' of the present invention. In this second embodiment, a composite epilayer structure 20 is formed on a vicinal Si(111) substrate 14. The composite epilayer structure 20 comprises a first layer of II–VI alloy 12 and a second layer of II–VI alloy 22. As in the first embodiment of the present invention, the first layer of said II–VI alloy 12 has a surface 16 corresponds to the (111) face of the zincblende structure. In particular, the first layer of II–VI alloy 12 comprises a ZnTe(111) epitaxial layer. The second layer of said II–VI alloy 22 also has a surface 24 that corresponds to the (111) face of the zincblende structure. The second layer of II–VI alloy 22 comprises a CdZnTe(111) epitaxial layer.

As in the first embodiment of the present invention, the Si(111) substrate 14 has a surface 18 that is a vicinal Si(111) plane. The first layer of II–VI alloy 12 is formed by depositing ZnTe on the surface 18 of the vicinal Si(111) substrate 14. The second layer of II–VI alloy 22 is formed by depositing CdZnTe on the surface 16 of the first layer of II–VI alloy 12. Deposition techniques such as MBE or OMVPE can be employed to deposit the ZnTe and the CdZnTe. Optimum growth conditions are employed in the deposition of the II–VI alloy. Such growth conditions are conventional and are described in the above-mentioned disclosed art; see, e.g., Y. P. Chen et al, supra. As described above, other suitable deposition techniques may be employed in the practice of the invention as well.

As in the first embodiment of the present invention, the surface 18 of the vicinal Si(111) substrate 14 is a vicinal Si(111) plane. The vicinal Si(111) plane is tilted 2° to 8° away from the exact Si(111) plane towards the (211) plane which is perpendicular to the [211] direction. Thus, the normal through the surface 18 of the vicinal Si(111) substrate 14 is tilted toward the [211] direction. The normal to the surface 18 of the vicinal Si(111) substrate 14 may alternatively be tilted toward other crystallographically equivalent directions.

The use of the vicinal Si(111) plane of the present invention enables the ZnTe(111) epitaxial layer and the CdZnTe(111) epitaxial layer to be formed without twinning, that is, substantially twin-free. As such, an epitaxial II–VI alloy film having a surface that corresponds to the (111) face of the zincblende structure is formed without forming twins therein. In this second embodiment, the II–VI alloy film corresponds to an epitaxial II–VI semiconductor film comprising the composite epilayer structure 20, i.e., the ZnTe (111) epitaxial layer 12 and the CdZnTe(111) epitaxial layer 22.

Measurements of x-ray rocking curve widths for asymmetric reflections can be employed to determine the extent of twinning; see, e.g., M. Oron et al, "X-ray study of the crystalline structure of CdTe grown on (001), (111)A, and (111)B CdTe surfaces by metalorganic chemical vapor deposition", *Applied Physics Letters*, Vol. 52, No. 13, pp. 1059–1061 (Mar. 28, 1988). As used herein, the term "substantially twin-free" means free of twins to the extent as measured by asymmetric x-ray rocking curve measurements; twin-free layers can be produced having asymmetric x-ray rocking curves widths of less than 80 arc-seconds. As described above, x-ray diffraction probes the entire depth of a film. For a film that is "substantially twin-free", x-ray diffraction measurements will not reveal any twin volume density throughout the film.

The structure 10 of the present invention is not limited to the epitaxially grown CdZnTe(111) utilized in the first embodiment of the present invention. Nor is structure 10' of the present invention limited to the epitaxially grown CdZnTe(111) layer and the epitaxial grown ZnTe(111) layer utilized in the second embodiment of the present invention. Other suitable II–VI alloys selected from the (ZnHgCd)/(SSeTe) alloy system may also be employed in the structure 10, 10' of the present invention. The (ZnHgCd)/(SSeTe) alloy system comprises alloy formed by combining Zn, Hg, and/or Cd with S, Se, and/or Te. Examples of such II–VI alloys suitably employed in the method of the present invention include CdS, CdSe, CdTe, ZnS, ZnSe, ZnTe, HgS, HgSe, HgTe, HgCdTe, HgZnTe, HgCdSe, CdZnTe, and CdTeSe.

As described above, the surface 18 of the vicinal Si(111) substrate 14 is a vicinal Si(111) plane. This vicinal Si(111) plane is tilted 2° to 8° away from the exact Si(111) plane towards the (211) plane. The misorientation, i.e., the angle which the vicinal Si(111) plane is tilted away from the exact Si(111) plane, is schematically depicted over the vicinal Si(111) substrate 14 in FIG. 2. This misorientation is a critical feature of the present invention. FIG. 2 shows vector $\hat{n}$ 26 which is normal to the surface 18 of the vicinal Si(111) substrate 14. FIG. 2 illustrates a vector 28 directed in the [111] direction. The vector 28, directed in the [111] direction, is by definition perpendicular to the (111) plane. FIG. 2 also shows a vector 30 directed in the [211] direction. The vector 30, directed in the [211] direction, is by definition perpendicular to the (211) plane. The angle θ 32 defines the angle that the normal to the surface 18 of the vicinal Si(111) substrate 14 (vector $\hat{n}$ 26) is tilted away from the normal to the Si(111) plane (vector 28). As such, angle θ 32 defines the angle that the vicinal Si(111) plane is tilted away from the exact Si(111) plane.

For twin-free growth of CdZnTe(111), the angle θ 32 of the misorientation can range from 2° to 8°. As described above, the vector $\hat{n}$ 26 can be tilted toward any of the three crystallographically equivalent directions, i.e., the [211] direction, the [121] direction, and the [112] direction.

Accordingly, the method of the present invention requires that the silicon substrate 14 be a vicinal Si(111) substrate having a surface that has an arrangement of silicon atoms that corresponds to a vicinal Si(111) plane. The vicinal Si(111) plane has a normal that is tilted an angle θ which is 2° to 8° away from the normal to the exact Si(111) plane and toward either the [211] direction, the [121] direction, or the [112] direction. A first layer of the II–VI alloy 12 is deposited on the surface of the vicinal Si(111) substrate 14.

The choice of the vicinal Si(111) crystallographic orientation of the present invention for the Si substrate results in the deposition of CdZnTe(111) films that are twin-free and of higher structural quality than has been demonstrated by prior art growth techniques. As described above, optimum growth conditions are employed in the deposition of the II–VI alloy. Such growth conditions are conventional and are described in the above-mentioned disclosed art; see, e.g., Y. P. Chen et al, supra. The benefits of utilizing the vicinal Si(111) plane of the present invention have not been disclosed in prior art.

As such, the method of the present invention provides a means for growing an epitaxial II–VI semiconductor film. The method of the present invention enables the epitaxial growth of HgCdTe(111) on Si using both LPE and MBE growth techniques. As described above, for HgCdTe growth by LPE, CdTe(111) and CdZnTe(111) are highly preferred over other crystallographic orientations. Accordingly, the method of the present invention provides an immediately useful technique for preparing CdZnTe on Si which is compatible with the existing HgCdTe LPE growth technology. In addition, low Hg flux is required for HgCdTe growth by MBE on CdTe(111) and CdZnTe(111). CdTe(111) and CdZnTe(111) are thus preferable for HgCdTe growth by MBE. Accordingly, CdZnTe formed on vicinal Si(111) substrates may find application in MBE.

EXAMPLES

Several structures 10, each comprising a CdZnTe(111) epitaxial layer 12 deposited on a vicinal Si(111) substrate 14, were formed using the method of the present invention. These structures 10 were similar to the crystal structure shown in FIG. 1a. The CdZnTe(111) epitaxial layer 12 was formed on the vicinal Si(111) substrate 14 by depositing CdZnTe on the surface 18 of the vicinal Si(111) substrate 14. MBE was employed to deposit the CdZnTe. For each of the structures 10, the surface 18 of the vicinal Si(111) substrate 14 was a vicinal Si(111) plane. The vicinal Si(111) plane was tilted away from the exact Si(111) plane towards the (211) plane.

Measurements of twin density and x-ray rocking curve widths were made to determine the effect of misorientation on twinning and crystalline quality. As described above, by misorientation is meant the angle which the vicinal Si(111) plane is tilted away from the exact Si(111) plane. To demonstrate the utility of choosing misorientation in the range of about 2° to 8°, a variety of vicinal Si(111) substrates 14 were employed. Each vicinal Si(111) substrate 14 had a vicinal Si(111) plane that was tilted away from the exact Si(111) plane at a different angle θ 32. The angle θ 32 for each vicinal Si(111) substrate 14 was in the range between 8° to −8°. Measurements of twin density and x-ray rocking curve widths were made on each of these crystal structures 10.

X-ray analysis was used to reveal the presence of twinning in the crystal structures 10. As described above, the presence of twins in a crystalline sample can be revealed by the measurement of appropriately selected x-ray diffractions. In particular, the twin density of the CdZnTe(111) epitaxial layer 12 was determined from measurements of the CdZnTe(224) peak intensity. The x-ray diffraction technique for measuring twin density in (111)-oriented epitaxial films is described more fully, e.g., by M. Oron et al, supra.

The (224) reflection was selected to measure the twin density in (111)-oriented epitaxial films because for films having no twins, the (224) reflection has three-fold symmetry about the [111] axis. As such, if the wafer having the film formed thereon which has no twins (non-twinned) is rotated 180°, then the (224) reflection is not present. In twinned films, volumes having twins will have a (224) reflection that is rotated by 180° with respect to the volume having no twins. Therefore, an x-ray diffraction pattern, or Laue pattern, of a film having both twinned regions and non-twinned regions will appear to have a six-fold symmetry.

Accordingly, to quantify CdZnTe twin volume fractions, the CdZnTe(224) peak intensity was measured for two substrate azimuths separated by 180°. This measurement technique can detect CdZnTe twin volume fractions down to $5 \times 10^{-4}$.

The crystalline quality of the crystal structures 10 was assessed by measuring the FWHM of the x-ray rocking curve for the (333) reflection. As described above, measuring the linewidth of symmetric reflections, can be used to probe the crystalline quality. The strength of the reflection at the detector of the x-ray diffractometer is measured as the sample is tilted or rocked. The crystalline quality of the crystalline sample is assessed from the FWHM of the x-ray rocking curve. Narrow diffraction lines indicate better crystallinity.

FIG. 3 shows the resultant twinning and width of the x-ray rocking curve for these crystal structures 10 having misorientations in the range between −8° to 8°. In particular, Curve 34 is a plot of the CdZnTe twin volume fraction, in percent, versus angle θ 32, in degrees. Curve 36 is a plot of the CdZnTe X-ray FWHM, i.e., the FWHM of the x-ray rocking, in arc-seconds, versus angle θ 32 in degrees.

Curve 34 and Curve 36 indicate that CdZnTe twinning is a serious problem for misorientations of the vicinal Si(111) plane towards the (211) plane that are less than about 2°. CdZnTe twinning disappears, however, when the misorientations of the vicinal Si(111) plane towards the (211) plane is greater than about 2°. Twinning is completely suppressed for tilt of the vicinal Si(111) plane towards the (211) plane where the angles θ 32 is greater than about 2°. Also, the narrowest x-ray rocking curves for the CdZnTe(333) reflection are obtained when the angle θ 32 is greater than about 2°. Region 38 of the plot in FIG. 3 corresponds to angles θ 32 greater than about 2° where the CdZnTe is twin-free and possesses high crystalline quality as shown by curve 34 and curve 36. Thus, Curve 34 and Curve 36 illustrate the high quality of CdZnTe (111) formed on Si that is obtainable from the method of the present invention. In particular, the method of the present invention enables twin-free growth of CdZnTe(111) on Si. Also, the method of the present invention enables the CdZnTe(111) to possess narrow x-ray rocking curves having FWHM less than 80 arc-seconds.

Accordingly, use of the vicinal Si(111) plane of the present invention enables the formation of CdTe(111) and CdZnTe(111) epitaxial layers that are both (1) twin-free and (2) possess x-ray rocking curves having widths in the 70 to 80 arc-second range. The formation of twin-free CdZnTe (111) epitaxial layers having x-ray rocking curve widths in the 70 to 80 arc-second range is a considerable improvement over prior art results. To achieve twin-free growth of CdZnTe(111) epitaxial layers having high crystalline quality, the method of the present invention utilizes a vicinal Si(111) plane near the exact Si(111) plane. In contrast, prior art techniques employ a vicinal Si(001) plane near the exact Si(001) plane. As such, the benefits of utilizing the vicinal Si(111) plane of the present invention have not been disclosed in prior art.

The structures 10, 10' comprising a (111)-oriented heteroepitaxial II–VI alloy film 12 formed on a vicinal Si(111) substrate 14 fabricated in accordance with the present invention can be used in the area of thermal imaging systems, i.e., for infrared detectors and infrared focal plane arrays.

Thus, there has been disclosed a method for fabricating a (111)-oriented heteroepitaxial II–VI alloy film formed on vicinal Si(111) substrate 14 for use in infrared detectors and infrared focal plane arrays. It will be readily apparent to those skilled in this art that various changes and modifications of an obvious nature may be made, and all such changes and modifications are considered to fall within the scope of the invention, as defined by the appended claims.

What is claimed is:

1. A method for forming at least one epitaxial II–VI alloy film on a silicon substrate, said at least one epitaxial II–VI alloy film having a surface that corresponds to the (111) face of the zincblende structure, said method comprising the steps of:

(a) providing a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (b) epitaxially depositing a first layer of said II–VI alloy film on said surface of said vicinal Si(111) substrate, said first layer of said II–VI alloy film being substantially twin-free.

2. The method of claim 1 wherein said II–VI alloy film is deposited by molecular beam epitaxy.

3. The method of claim 1 wherein said II–VI alloy film is deposited by organometallic vapor phase epitaxy.

4. The method of claim 1 wherein said II–VI alloy film comprises an alloy formed by combining at least one Group II element selected from the group consisting of Zn, Hg, and Cd with at least one Group VI element selected from the group consisting of S, Se, and Te.

5. The method of claim 4 wherein said alloy is selected from the group consisting of ZnS, ZnSe, ZnTe, HgS, HgSe, HgTe, CdS, CdSe, CdTe, HgCdTe, HgZnTe, HgCdSe CdTeSe, and CdZnTe.

6. The method of claim 5 wherein said alloy comprises CdZnTe.

7. The method of claim 1 wherein said epitaxial II–VI alloy film comprises a composite epilayer structure comprising said first layer of said II–VI alloy film and a second layer of a different II–VI alloy film on said first layer, said second layer being substantially twin-free.

8. The method of claim 7 wherein said second layer of said different II–VI alloy film comprises an alloy formed by combining at least one Group II element selected from the group consisting of Zn, Hg, and Cd with at least one Group VI element selected from the group consisting of S, Se, and Te.

9. The method of claim 8 wherein said first layer of said II–VI alloy film comprises a ZnTe(111) epitaxially-deposited layer and said second layer of said II–VI alloy film comprises a CdZnTe(111) epitaxially-deposited layer.

10. The method of claim 1 wherein HgCdTe is deposited on said surface of said II–VI alloy film to thereby form a layer of epitaxial HgCdTe(111).

11. A crystal structure comprising:

(a) a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (b) a first layer of a substantially twin-free II–VI alloy film formed on said surface of said vicinal Si(111) substrate, said first layer of said II–VI alloy film having a surface that corresponds to the (111) face of the zincblende structure.

12. The crystal structure of claim 11 wherein said II–VI alloy film comprises an alloy formed by combining at least one Group II element selected from the group consisting of Zn, Hg, and Cd with at least one Group VI element selected from the group consisting of S, Se, and Te.

13. The crystal structure of claim 12 wherein said alloy is selected from the group consisting of ZnS, ZnSe, ZnTe, HgS, HgSe, HgTe, CdS, CdSe, CdTe, HgCdTe, HgZnTe, HgCdSe, CdTeSe, and CdZnTe.

14. The crystal structure of claim 13 wherein said alloy comprises CdZnTe.

15. The crystal structure of claim 11 further comprising a layer of epitaxial HgCdTe(111) formed on said surface of said first layer of said II–VI semiconductor film.

16. The crystal structure of claim 11 further comprising a second layer of a different II–VI alloy film formed on said first layer of said II–VI semiconductor film, said second layer of said different II–VI alloy film being substantially twin-free and having a surface that corresponds to the (111) face of the zincblende structure.

17. The crystal structure of claim 16 wherein said second layer of said different II–VI alloy film comprises an alloy formed by combining at least one Group II element selected from the group consisting of Zn, Hg, and Cd with at least one Group VI element selected from the group consisting of S, Se, and Te.

18. The crystal structure of claim 17 wherein said first layer of said II–VI alloy film comprises a ZnTe(111) epitaxial layer and said second layer of said II–VI alloy film comprises a CdZnTe(111) epitaxial layer.

19. The crystal structure of claim 16 wherein a layer of epitaxial HgCdTe(111) is formed on said surface of said second layer of said II–VI semiconductor film.

20. A method for forming at least one epitaxial II–VI alloy film on a silicon substrate, said at least one epitaxial II–VI alloy film having a substrate that corresponds to the (111) face of the zincblende structure, said method comprising the steps of:

(a) providing a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (b) epitaxially depositing a first layer of said II–VI alloy film on said surface of said vicinal Si(111) substrate, said first layer of said II–VI alloy film being substantially twin-free and characterized by an x-ray rocking curve width between about 70 to 80 arc-seconds.

21. A method for forming at least one epitaxial II–VI alloy film on a silicon substrate, said at least one epitaxial II–VI alloy film having a substrate that corresponds to the (111) face of the zincblende structure, said method comprising the steps of:

(a) providing a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (b) epitaxially depositing a first layer of said II–VI alloy film on said surface of said vicinal Si(111) substrate, said first layer of said II–VI alloy film being substantially twin-free, said step of depositing occurring in the substantial absence of an in-plane rotation slip of said first layer.

22. A crystal structure comprising:

(a) a vicinal Si(111) substrate having a surface that has an arrangement of silicon atoms that corresponds to a vicinal Si(111) plane having a normal that is tilted 2° to 8° away from the normal to the exact Si(111) plane and toward either the [211] direction, the [121] direction, or the [112] direction; and (a) a first layer of a substantially twin-free II–VI alloy film formed on said surface of said vicinal Si(111) substrate, said first layer of said II–VI alloy film having a surface that corresponds to the (111) face of the zincblende structure and characterized by an x-ray rocking curve width between about 70 to 80 arc-seconds.

* * * * *